(12) United States Patent
Kuo et al.

(10) Patent No.: US 7,443,005 B2
(45) Date of Patent: Oct. 28, 2008

(54) LENS STRUCTURES SUITABLE FOR USE IN IMAGE SENSORS AND METHOD FOR MAKING THE SAME

(75) Inventors: Ching-Sen Kuo, Taipei (TW); Feng-Jia Shiu, Hsinchu (TW); Gwo-Yuh Shiau, Hsinchu (TW); Jieh-Jang Chen, Hsinchu (TW); Shih-Chi Fu, Taipei (TW); Chien Hsien Tseng, Hsinchu (TW); Chia-Shiung Tsai, Hsin-Chu (TW); Yuan-Hung Liu, Hsin-Chu (TW); Yeur-Luen Tu, Taichung (TW); Chih-Ta Wu, Hsin-chu (TW); Chi-Hsin Lo, Zhubei (TW)

(73) Assignee: Tiawan Semiconductor Manufacturing Co., Ltd., Hsin-Chu (TW)

( * ) Notice: Subject to any disclaimer, the term of this patent is extended or adjusted under 35 U.S.C. 154(b) by 457 days.

(21) Appl. No.: 10/982,978

(22) Filed: Nov. 5, 2004

(65) Prior Publication Data
US 2005/0274968 A1    Dec. 15, 2005

Related U.S. Application Data

(60) Provisional application No. 60/578,529, filed on Jun. 10, 2004.

(51) Int. Cl.
    *H01L 29/78* (2006.01)
(52) U.S. Cl. .................. 257/432; 257/436
(58) Field of Classification Search .......... 257/121, 257/432, 436
    See application file for complete search history.

(56) References Cited

U.S. PATENT DOCUMENTS

| 6,301,051 | B1 | 10/2001 | Sankur | |
|---|---|---|---|---|
| 6,577,342 | B1 | 6/2003 | Wester | |
| 6,583,438 | B1 | 6/2003 | Uchida | |
| 6,587,147 | B1 | 7/2003 | Li | |
| 6,624,404 | B2 | 9/2003 | Lee et al. | |
| 6,639,726 | B1 | 10/2003 | Campbell | |
| 6,646,808 | B2 | 11/2003 | Li | |
| 6,665,014 | B1 | 12/2003 | Assadi et al. | |
| 6,736,626 | B1 | 5/2004 | Lienau | |
| 6,821,810 | B1 * | 11/2004 | Hsiao et al. | 438/69 |
| 7,064,405 | B2 * | 6/2006 | Kondo et al. | 257/436 |

* cited by examiner

*Primary Examiner*—Douglas M Menz
(74) *Attorney, Agent, or Firm*—Duane Morris LLP

(57) ABSTRACT

An image sensor includes a double-microlens structure with an outer microlens aligned over an inner microlens, both microlenses aligned over a corresponding photosensor. The inner or outer microlens may be formed by a silylation process in which a reactive portion of a photoresist material reacts with a silicon-containing agent. The inner or outer microlens may be formed by step etching of a dielectric material, the step etching process including a series of alternating etch steps including an anisotropic etching step and an etching step that causes patterned photoresist to laterally recede. Subsequent isotropic etching processes may be used to smooth the etched step structure and form a smooth lens. A thermally stable and photosensitive polymeric/organic material may also be used to form permanent inner or outer lenses. The photosensitive material is coated then patterned using photolithography, reflowed, then cured to form a permanent lens structure.

22 Claims, 9 Drawing Sheets

FIGURE 1 - PRIOR ART

LENS STRUCTURES SUITABLE FOR USE IN IMAGE SENSORS AND METHOD FOR MAKING THE SAME

RELATED APPLICATION

This application is related to, and claims priority from U.S. provisional patent application Ser. No. 60/578,529, filed Jun. 10, 2004.

FIELD OF THE INVENTION

The present invention relates, most generally, to a solid state imaging device, and more particularly to lenses used in such imaging devices and methods for making the same.

BACKGROUND

Solid state imaging devices typically include a photosensor such as a photodiode formed in or on a substrate, a color filter formed over the photosensitive device and a microlens array formed over the color filter. The photosensor may be a photodiode, a CMOS (complimentary metal oxide semiconductor) sensor or a charge-coupled device (CCD), for example. N+ type photosensors (NPS's) are commonly used. Between the photosensor and the color filter there is generally a relatively thick inter-metal dielectric (IMD) that accommodates multiple levels of metallization used as an interconnection medium in the peripheral circuits of the solid state imaging device. It is clearly desirable to maximize the sensitivity of the imaging device, i.e., the amount of light that reaches the photosensors. One shortcoming of imaging devices is that the sensitivity of the photosensor is proportional to the fill factor which is defined as the ratio of the area of the photosensor to that of the pixel area. The thick inter-metal dielectric makes it difficult to align the lens and photosensor and insure that the light which passes through the lens, reaches the photosensor. The amount of light that is not directed to the photosensor increases with increasing thickness of the IMD. Furthermore, the interconnect metal disposed within the inter-metal dielectric may reflect incident light further reducing the optical signal and therefore the sensitivity of the photosensor.

It would therefore be desirable to produce an imaging device with a modified structure that increases the sensitivity of the imaging device by allowing more light to be received by the photosensors.

SUMMARY OF THE INVENTION

To address these and other needs and in view of its purposes, an aspect of the invention provides a method for forming an imaging device. The method comprises providing a substrate with a photosensor formed therein or thereon, forming a lens over the substrate and forming a color filter over the lens.

According to one aspect, the lens is formed by forming a layer of photosensitive material over the substrate, patterning the layer by exposing portions thereof to light and developing to produce at least a patterned photosensitive section which is then thermally reflowed and cured to cause the photosensitive material to cross-link and form the lens.

According to another aspect, the lens is formed by forming a dielectric layer over the substrate and forming the lens by etching the dielectric layer. The dielectric is etched by forming a discrete photosensitive section over the dielectric layer, thermally reflowing the discrete photosensitive section, performing a succession of at least two alternating etch steps comprising a recede step that urges lateral recession of edges of the discrete photosensitive section, and an anisotropic step that etches substantially downward.

According to another aspect, provided is a method for forming an imaging device comprising providing a substrate with a photosensor formed therein or thereon and forming a silylated lens over the substrate by forming a photoresist layer, patterning the photoresist layer to form a reactive portion of the photoresist layer and causing the reactive portion to react with a silicon-containing agent. The silylated lens may be an inner or outer microlens of a double-microlens structure.

In another aspect, an imaging device is provided. The imaging device comprises a substrate with a photosensor formed therein or thereon, a lens disposed over the photosensor and a color filter disposed over the lens.

In another aspect, an imaging device is provided. The imaging device comprises a substrate having a plurality of photosensors formed therein or thereon, a corresponding plurality of inner lenses disposed over the plurality of photosensors, a color filter disposed over the plurality of lenses, and a corresponding plurality of microlenses disposed over the color filter.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

DETAILED DESCRIPTION

Figure 1:
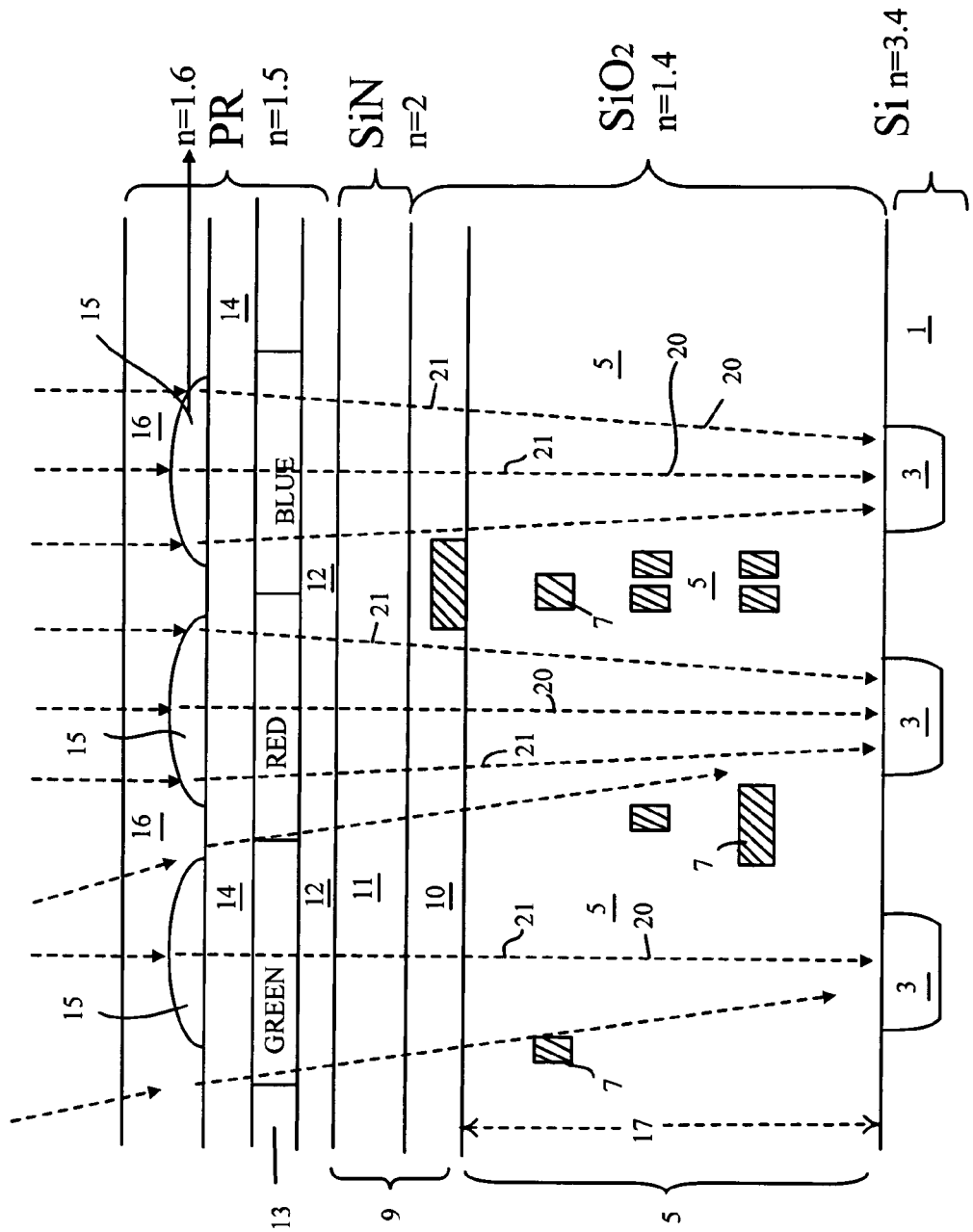
FIG. 1 is a cross-sectional view of an image sensor according to the PRIOR ART.

FIG. 1 shows an exemplary solid state imaging device and includes sensors 3 formed in substrate 1 according to the PRIOR ART. Sensors 3 are photosensitive devices and may be photodiodes or other photosensors. The imaging device also includes inter-metal dielectric, IMD 5 that may include several levels of metal interconnect leads 7 which are desirably disposed between the sensors 3 so as not to deflect or impede light rays 21 from reaching sensors 3. Passivation level 9 may include a silicon nitride film 11 and further dielectric layer 10 which may be formed by the chemical vapor deposition of a high density plasma. The image sensor also includes plain layer 12, color filter 13, microspacer 14 and microlenses 15 aligned over sensors 3. Overcoat 16 covers microlenses 15 and may be formed of suitable materials such as acrylate, methacrylate, epoxy-acrylate, or polyimide and include a thickness of 0.3-3.0 μm. Plain layer 12 may have a refractive index of 1.4-1.7, may be composed of acrylate, methacrylate, epoxy-acrylate, or polyimide and include a thickness of 0.3-3 μm. Microspacer 14 may have a refractive index of 1.4-1.7, may be composed of acrylate, methacrylate, epoxy-acrylate, or polyimide and include a thickness of 0.3-3 μm. Color filter 13 may have a refractive index of 1.4-1.7, may be composed of acrylate, methacrylate or epoxy-acrylate and indicates a thickness of 0.3-2.5 μm. It can be seen that the thickness 17 of IMD 5 necessary to accommodate the multiple layers of metal interconnects leads 7 positions the microlenses 15 distant from corresponding sensors 3, potentially diminishing the amount of light that reaches the sensors 3.

FIGS. 2A-2F show essential features of various exemplary image sensor structures according to the present invention. Each of the exemplary image sensor structures includes substrate 1, sensor 3, and IMD 5. Substrate 1 may be formed of silicon or other suitable materials. IMD 5 may be an oxide, $SiO_2$, that includes a refractive index of about 1.4 but various other suitable dielectrics may alternatively be used and IMD 5 may include multiple dielectric layers. Within IMD 5, multiple layers of metal interconnect leads 7 are disposed. Sensor 3 may be a photodiode or other photosensitive devices such as CCD or CMOS photosensors, but various other photosensors may be used in other exemplary embodiments. Sensors 3 may be formed in or on substrate 1. Each of the exemplary image sensors shown in FIGS. 2A-2F also include microlens 15 disposed over color filter 13 and preferably aligned over an inner lens and a corresponding sensor 3. According to one exemplary embodiment, the area ratio of microlens 15 to corresponding sensor 3 is substantially larger than 2 for effective working of the photosensor. Microlenses 15 may be formed aligned over sensors 3. Passivation level 9 may include a silicon nitride portion and a further dielectric portion that may be formed by the chemical vapor deposition of a high density plasma. The image sensors also include plain layer 12, color filter 13, microspace 14 and overcoat 16. Overcoat 16 covers microlenses 15 and may be formed of suitable materials such as acrylate, methacrylate, epoxy-acrylate, or polyimide and includes a refractive index of about 1.2-1.5 Overcoat 16 includes a planar top surface 18. In an exemplary embodiment, color filter 13 may be an alternating sequence of red, green, and blue, but other color filters such as CMYG filter or a gray filter may be used in other exemplary embodiments.

Figure 2:
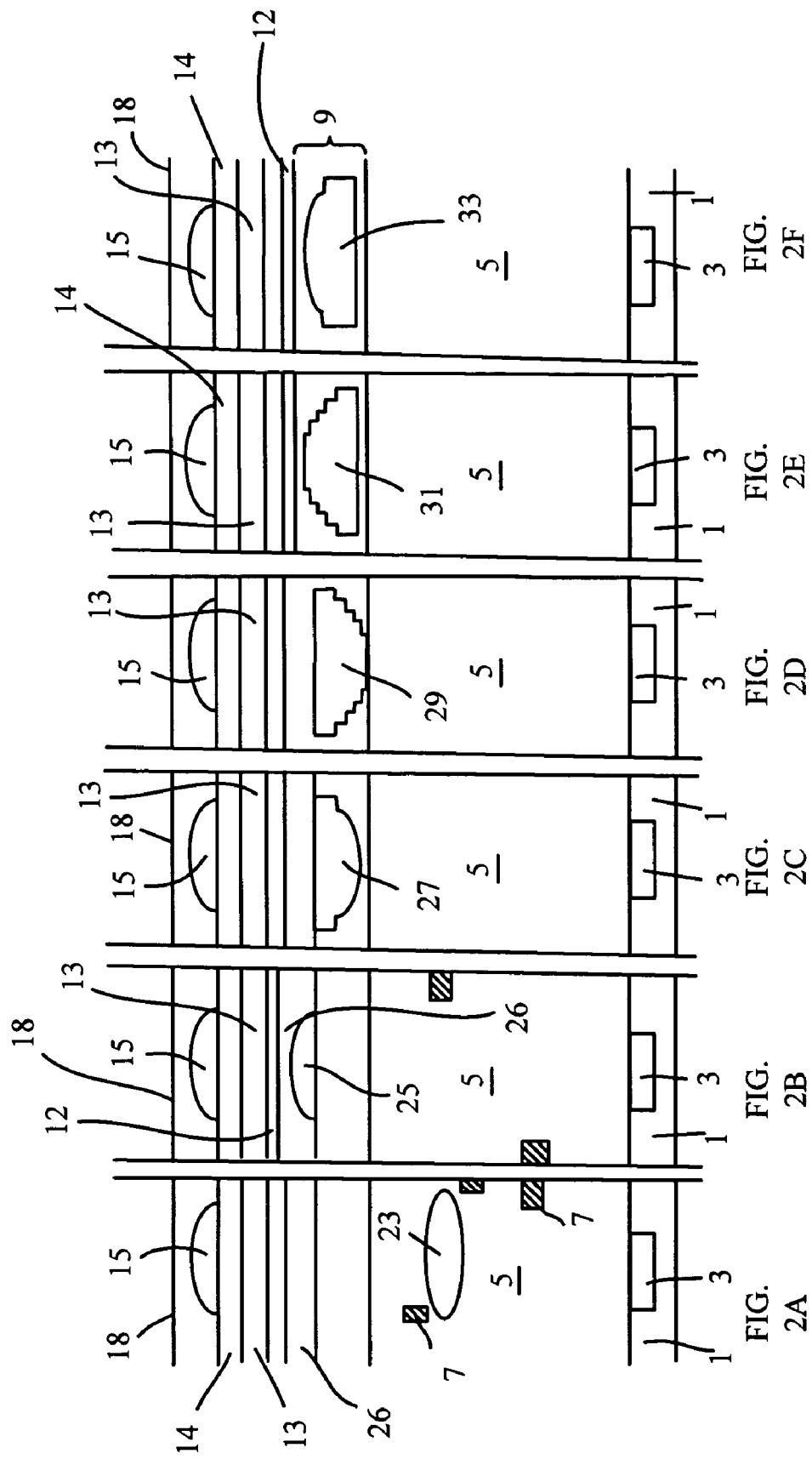
FIGS. 2A-2F are cross-sectional views showing exemplary image sensors of the invention.

The exemplary double microlens embodiment shown in FIG. 2A includes silylated lens 23 formed within IMD 5 and includes passivation nitride layer 26 in passivation portion 9. Silylated lens 23 is bi-convex in shape. The double microlens image sensor shown in FIG. 2B includes inner lens 25 which may be formed of a thermally-cured photosensitive material and which is disposed between color filter 13 and substrate 1. Inner lens 25 is plano-convex in shape. FIG. 2C shows an exemplary image sensor with a double microlens arrangement including microlens 15 and convex-down microlens 27 which may be formed by the step etching of a dielectric material, then smoothing. FIG. 2D shows a double microlens structure including microlens 15 and convex-down Fresnel lens 29 which may be formed by the step etching of a dielectric material. The double microlens structure of FIG. 2E shows convex-up Fresnel lens 31 which may be formed by step etching and is disposed between microlens 15 and substrate 1. FIG. 2F shows a double microlens structure including microlens 15 and inner microlens 33 which is a convex-up microlens and may be formed by step etching a dielectric material, then rounding. In an exemplary embodiment, inner lenses 27, 29, 31 and 33 may be formed of silicon nitride which has a refractive index of about 2, or other dielectric materials. Inner lenses 27 and 29 may be formed by etching a material subjacent the silicon nitride and inner lenses 31 and 33 may be formed by etching silicon nitride. According to one exemplary embodiment, an area ratio of any of the inner lenses (23, 25, 27, 29, 31, or 33) to corresponding sensor 3 may be substantially larger than 2 for effective working of the photosensor. According to one exemplary embodiment, inner lens 23, 25, 27, 29, 31, or 33 and microlens 15 are made from same material. In another exemplary embodiment, inner lens 23, 25, 27, 29, 31, or 33 and microlens 15 are made from different materials. In one exemplary embodiment, inner lens 23, 25, 27, 29, 31, or 33 and microlens 15 have similar shapes. In another exemplary embodiment, inner lens 23, 25, 27, 29, 31, and 33 and microlens 15 are of different shapes.

Figure 3:
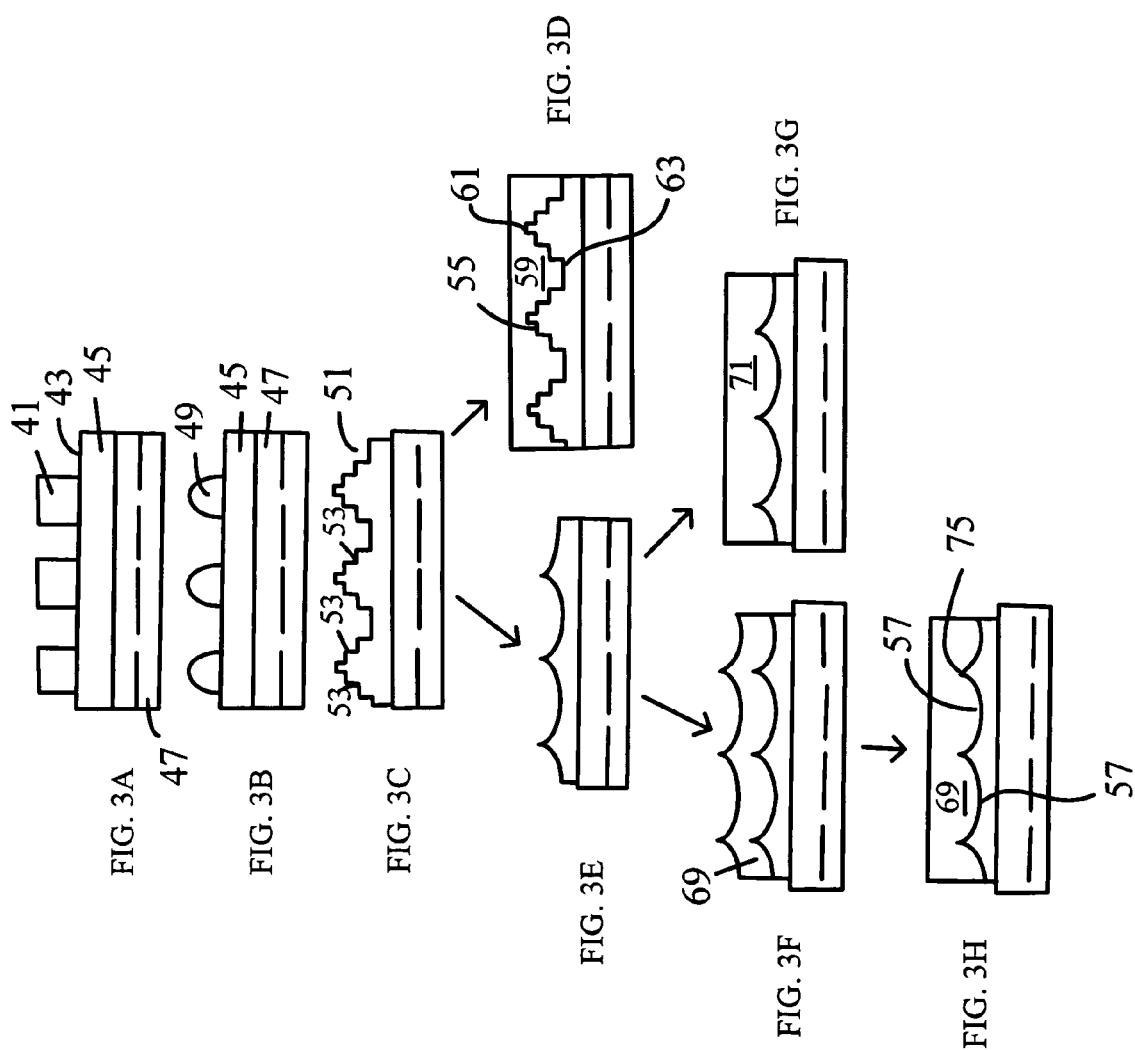
FIGS. 3A-3H are cross-sectional views showing a sequence of processing operations used to form exemplary microlenses according to the invention.

According to one exemplary embodiment, the inner lenses 23, 25, 27, 29, 31, and 33 or outer microlens 15 may be formed by the ladder or step etching of a dielectric material. FIGS. 3A-3H show process sequences for forming steps or terraces using various step etching embodiments. Step etching is advantageously used to control lens height and profile. FIG. 3A shows discrete sections of photoresist 41 formed over surface 43 of dielectric 45 formed, in turn, over substrate 47. Dielectric 45 may be an oxide, a nitride, or other dielectric materials used in image sensors. Dielectric 45 may be formed by the chemical vapor deposition of a high density plasma or using other techniques. Discrete sections of photoresist 41 are formed from photoresist which may be positive or negative photoresist. The thickness of photoresist 41 may range from 0.4 microns to 2.0 microns but other thicknesses may be used in other exemplary embodiments. The photoresist is then thermally reflowed to produce rounded discrete photoresist sections 49 shown in FIG. 3B.

The step etching process sequence is then carried out and may include a succession of alternating etching steps used to alternately laterally recede the edges of rounded discrete photoresist sections 49 and anisotropically etch dielectric 45 downward. In one exemplary embodiment, dielectric layer 45 may be a silicon nitride layer that also serves as a passivation layer. The alternating etching steps include a downward (anisotropic) etching step and a photoresist pull back step which, together, may be considered a unit process for forming one step. The number of steps produced is determined by the number of unit processes used. Aggregate step height generally controls microlens thickness and the degree and amount of photoresist pull back determines the slope of the lens. The two alternating etching steps have alternating selectivities. According to one exemplary embodiment in which silicon nitride is the dielectric, the silicon nitride:photoresist selectivity in the anisotropic etching step that essentially etches the dielectric downward may range from 8-10:1. In the pull back step that causes the photoresist to laterally recede, the silicon nitride:photoresist selectivity may range from 0.1-0.8:1. Other selectivities and other relative selectivities may be produced and utilized depending on the material being etched, the process used and the shape of the lens desired. The etching steps may be carried out in an ECR (electron cyclotron resonance) etcher, an inductively coupled plasma (ICP) etcher or other etching systems such as reactive ion etchers. The anisotropic etching step may include $CH_3F$ at 10-50 sccm, $O_2$ at 5-15 sccm, Ar at 10-50 sccm, 5-80 mTorr pressure and 150-350 watts RF power in one exemplary embodiment. The pull back step may include $CH_3F$ at 10-20 sccm, $O_2$ at 15-50 sccm, Ar at 10-50 sccm, a pressure of 5-80 millitorr and an RF power of 150-350 watts. Other etching conditions may be used in other embodiments. The step etching process sequence produces step structure 51 shown in FIG. 3C. Step structure 51 includes a plurality of steps 53. The height of each of successive steps is generally determined by the anisotropic etching step and the width of the steps 53 is generally determined by the recede, or pull back etch step.

Figure 4:
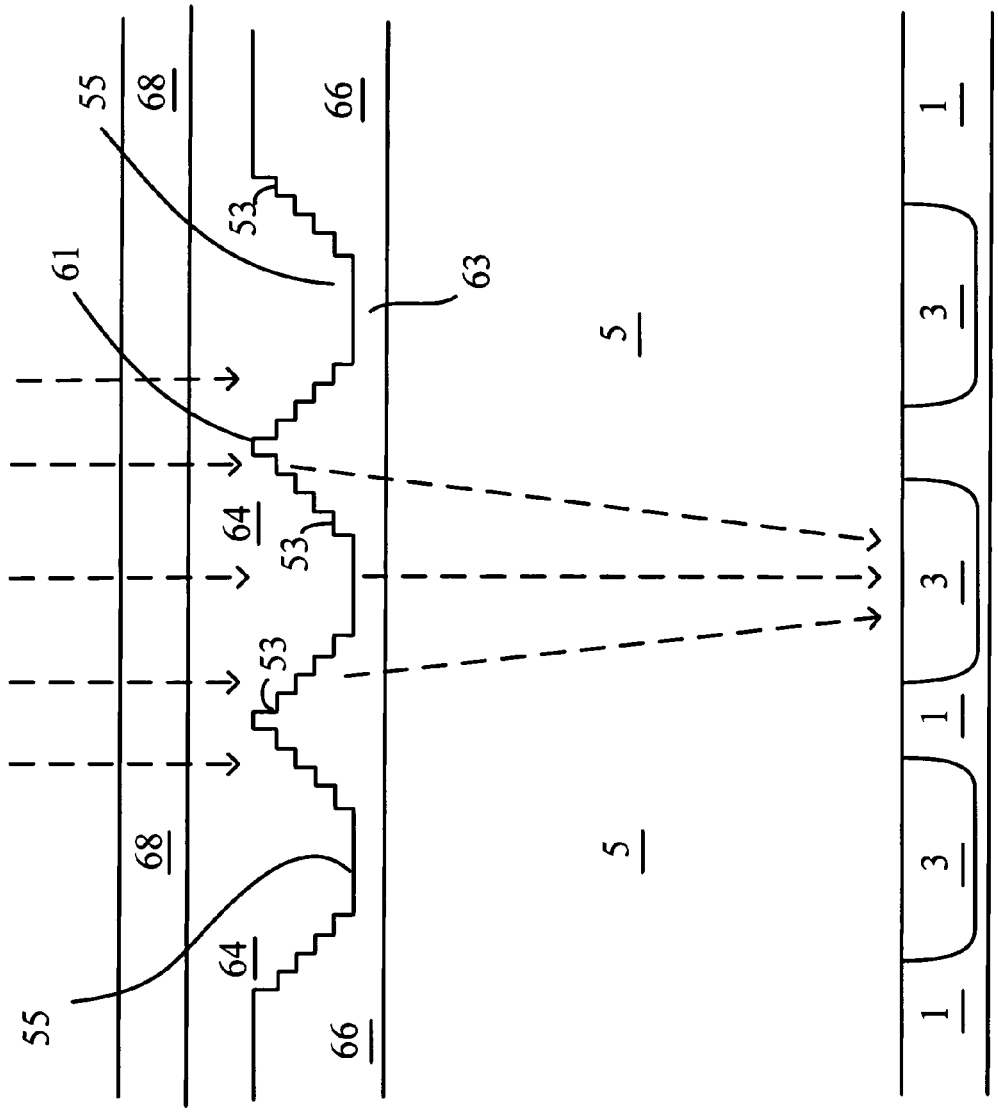
FIG. 4 is a cross-sectional view of an exemplary image sensor with a Fresnel lens formed according to the invention.
Figure 5:
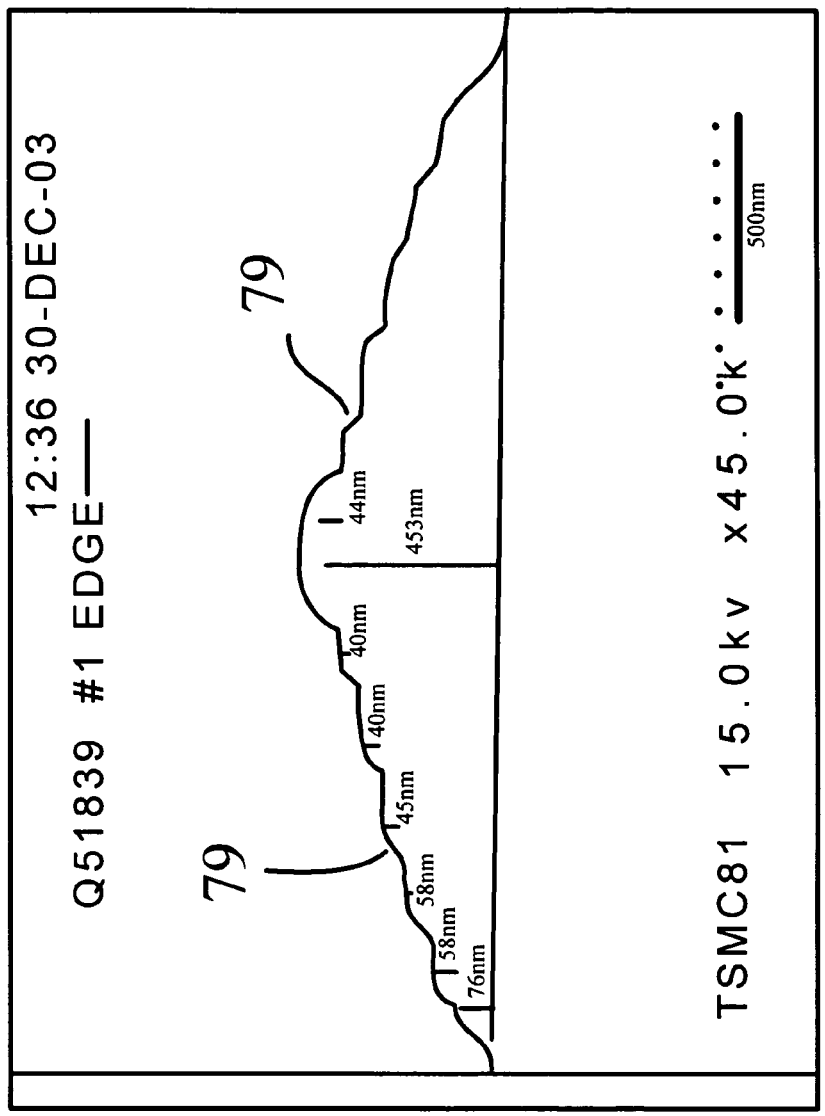
FIG. 5 is an SEM micrograph of an exemplary microlens of the invention.

In one embodiment, the etched structure including steps may be used to form a Fresnel lens as shown in FIG. 3D. Fresnel lenses are designed to enable a large size and short focal length without requiring the weight and volume of material required in standard lens designs. Fresnel lenses are broken into a set of concentric annular sections known as fresnel zones. For each of these zones, the overall thickness of the lens is decreased, effectively chopping the continuous surface of a standard lens into a set of surfaces of the same curvature, with discontinuities between them. Dielectric 45 may be an oxide or nitride and the etched step structures formed in dielectric 45 may be covered by further dielectric 59 to form Fresnel lenses. Further dielectric 59 may be planarized after formation using chemical mechanical polishing or it may be simply be spin coated over dielectric 45 and planarized upon formation. In one exemplary embodiment, dielectric 45 may be an oxide and further dielectric 59 a nitride or polyimide. According to another exemplary embodiment in which dielectric 45 is an oxide, further dielectric 59 may be silicon nitride which may be planarized after deposition. In an exemplary embodiment, further dielectric 59 formed over the etched material, dielectric 45, is chosen to have a greater refractive index than dielectric 45. Fresnel lenses 55 that are immediately adjacent one another include a common edge which may be considered edge 61 or edge 63. The Fresnel lens serves as a wavelength filter as only particular wavelengths of light pass through the different steps 53. FIG. 4 also shows immediately adjacent Fresnel lenses 55 including common edge 61 or 63 and respectively aligned over corresponding sensors 3. There is no gap between adjacent Fresnel lenses 55. In the embodiment shown in FIG. 4, Fresnel lenses 55 may be convex-down and formed of silicon nitride 64 having an index of refraction of about 2 and formed over silicon dioxide, $SiO_2$ 66 having a refractive index of about 1.4. Color filter 68 may have a refractive index of about 1.4-1.7 in an exemplary embodiment. FIG. 5 is an SEM (scanning electron microscope) micrograph showing an exemplary step etched structure such as can be used as a Fresnel lens or which may be subsequently rounded. The etched structure of FIG. 5 includes a plurality of steps 79 which may alternatively be described as terraces.

Now referring to FIGS. 3E-3H, the stepped structure shown in FIG. 3C may be smoothed using an isotropic etching step that eliminates the steps and produces a smoothed or rounded contour as shown in FIG. 3E. The shape of the step etched features of FIG. 3C is closely retained. The isotropic etching step may be a plasma etch, a chemical dry etch (CDE) or a wet etch, for example, an oxide dip. In one embodiment, an isotropic plasma may include $CF_4$ at 50-200 sccm, $O_2$ at 80-250 sccm, a pressure of 20-50 pa and 250-700 watts RF power, but other processes may be used in other exemplary embodiments. The structure shown in FIG. 3E may have a further material formed over it such as shown in FIGS. 3F and 3G. In FIG. 3F, conformal further material 69 is formed over dielectric 45. Further material 69 may be a dielectric. In FIG. 3G, further material 71 may be spin-coated and planarized upon formation. The spin-coated further material 71 may be a polyimide but other dielectric materials may be used. Referring again to FIG. 3F, in an exemplary embodiment, dielectric 45 may be an oxide film and further material 69 may be a nitride or other film that is subsequently planarized to produce the structure shown in FIG. 3H. FIG. 3H shows planarized further material 69 and a plurality of concave-down lenses 57 that are immediately adjacent one another and share a common edge 75. In other words, lenses 57 shown in FIGS. 3E-3H are gapless to provide for maximum light efficiency. In other embodiments, lenses 57 may be in close proximity.

Figure 6:
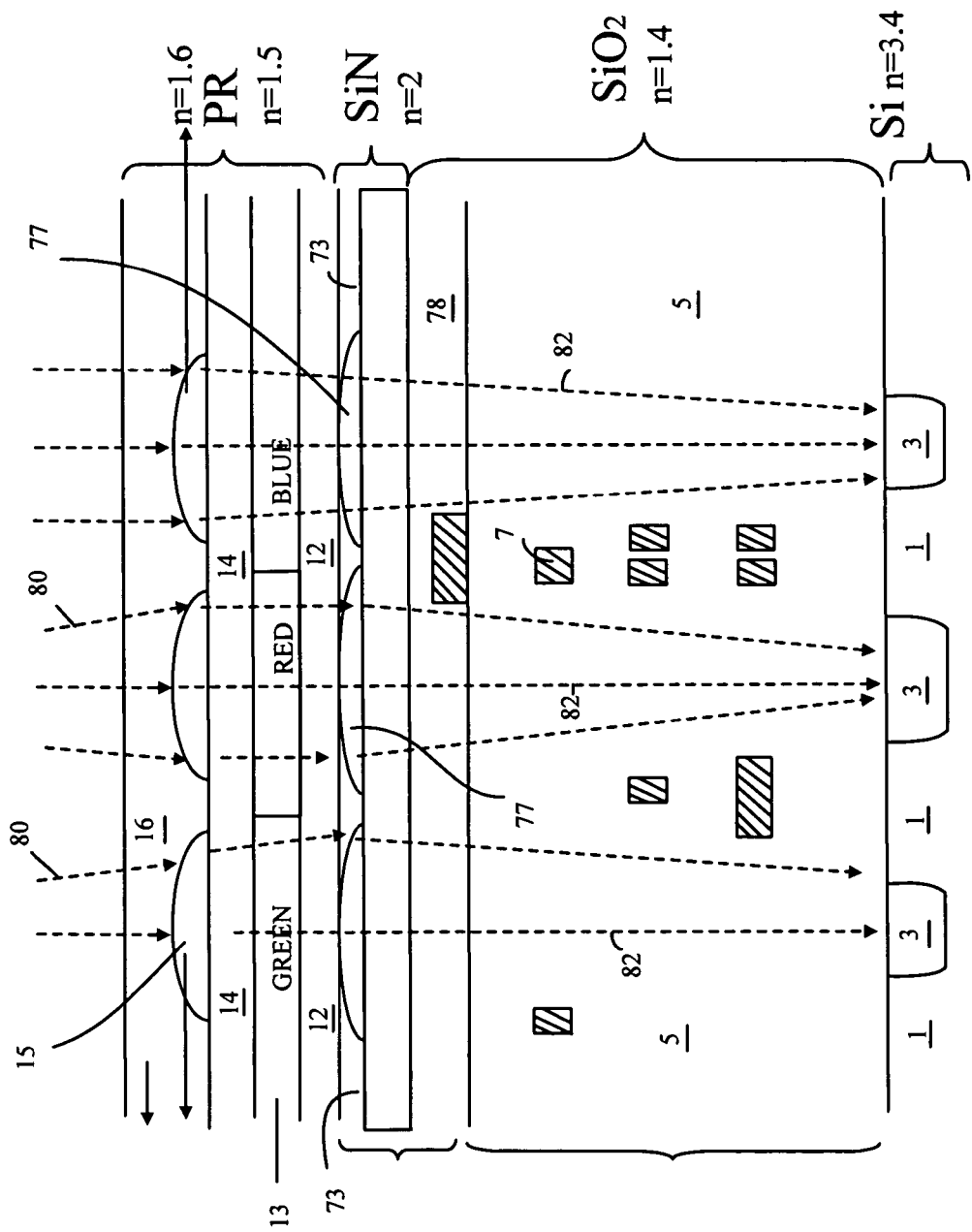
FIG. 6 shows an image sensor with an exemplary double microlens structure according to the invention.

The materials used in FIGS. 3A-3H may vary in other exemplary embodiments. The dielectric film that is etched may be an oxide, nitride or other dielectric film. Formed over the oxide, nitride or other dielectric film may be various other dielectric films. In each case the lens is the product of the lower material dielectric 45 and an upper material such as further dielectric 59, further material 69 or further material 71, either of which are planarized and advantageously have a refractive index greater than that of dielectric 45. The step etching sequence may be used to illustrate the formation of an inner microlens of a double microlens structure or it may be used to form the upper microlens of a double microlens embodiment or the only microlens of a single microlens image sensor. For example, the lens structures illustrated in FIGS. 3D, 3G, and 3H may be used as the inner microlenses of a double microlens image sensor such as shown in FIG. 6. FIG. 6 shows a plurality of double microlens image structures including inner lenses 77 that are convex-up and formed of silicon nitride and over silicon dioxide layer 78 which serves as part of the passivation or an IMD. Inner lenses 77 are covered by planarizing layer 73 which is a dielectric. The double-microlens structure also includes upper microlenses 15. Convex-up inner microlenses 77 are in close proximity to one another. The double microlens structure is efficient in assuring that incoming light, illustrated as light rays 80, is directed as directed rays 82 towards sensors 3.

Figure 7A:
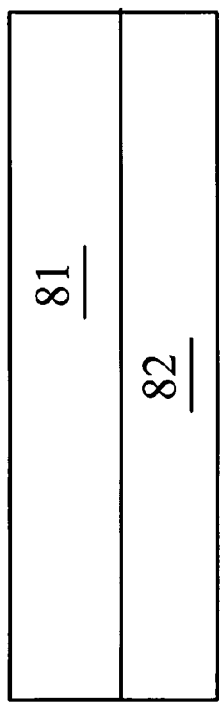
FIGS. 7A-7C are cross-sectional views showing a sequence of operations used to form another exemplary lens of the invention.
Figure 7B:
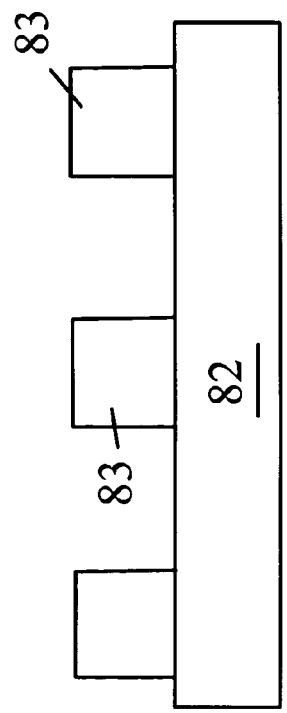
Figure 7C:
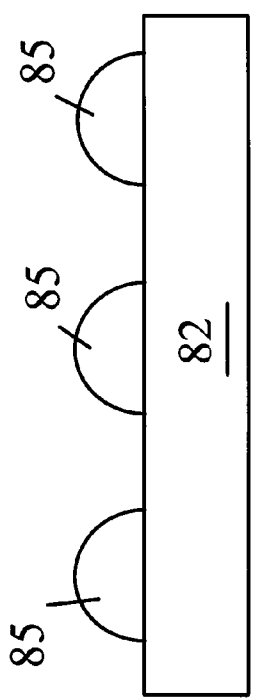
Figure 8:
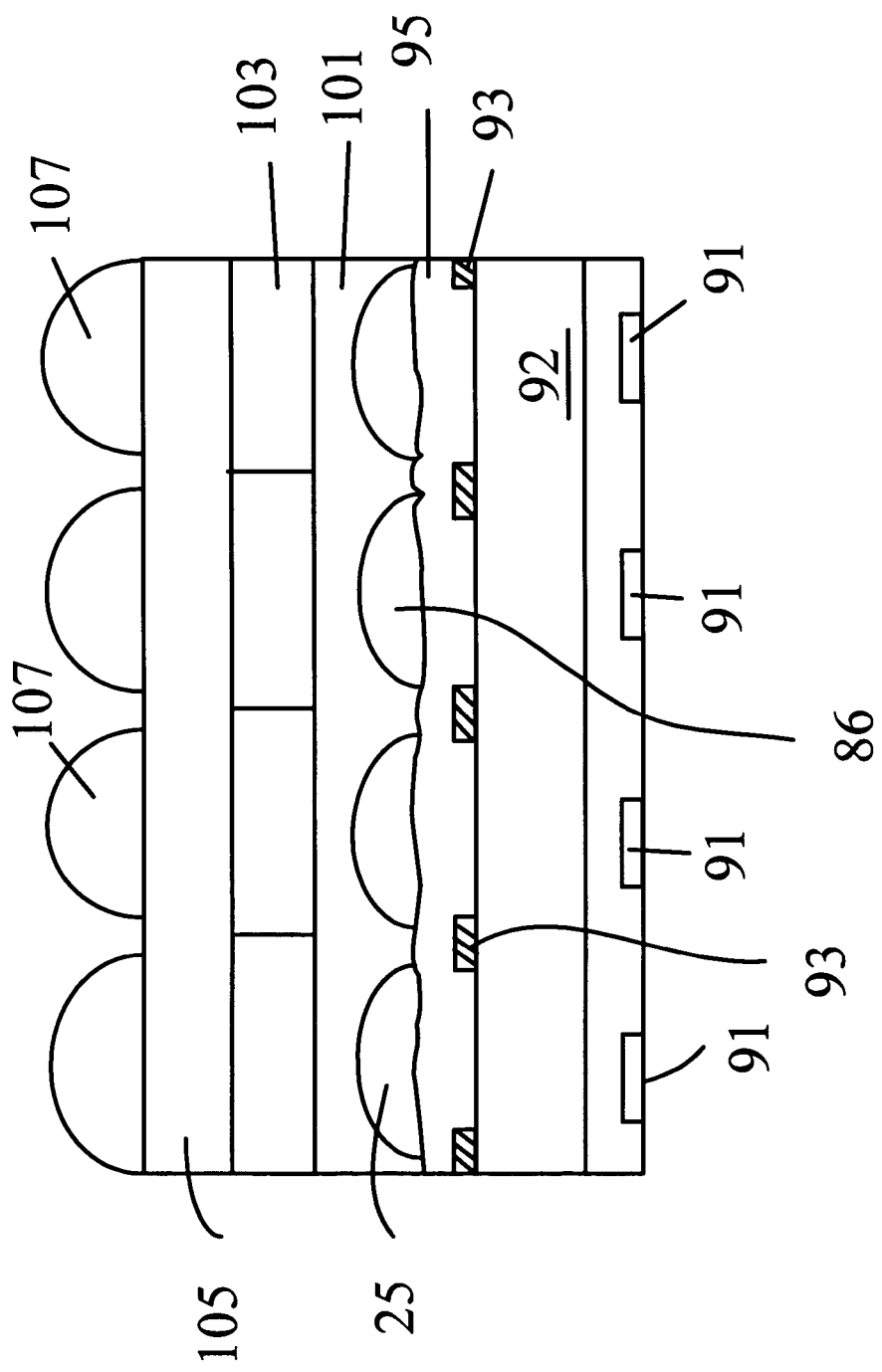
FIG. 8 is a cross-sectional view of an image sensor including an inner microlens.

In another exemplary embodiment, a polymer-type photosensitive material may be used to form microlenses (15, in FIGS. 2A-2F) or the inner lenses. Referring to FIG. 7A, film 81 is a photolithographically sensitive material that may be similar to photoresist. Film 81 may be an organic material, a polyimide, an epoxy-acrylated resin or another photosensitive polyimide. Underlying material 82 may be a passivation or dielectric layer formed at various locations within the imaging device. Direct lithography will be used to form permanent lenses directly from film 81 formed at various levels of the image sensor. Photolithographic patterning techniques such as masking, exposure and developing, are used to form discrete portions 83 from film 81 such as shown in FIG. 7B. Film 81 is formed of a material chosen to be easily patterned using lithographic techniques and to include high thermal stability once cured, since it will form a permanent lens. Film 81 is further chosen to provide high transparency for visible light and may advantageously include a refractive index of about 1.7 or greater. Film 81 is formed of a material that is easily thermally reflowed. Various conditions may be used to thermally reflow discrete portions 83 and produce the structure shown in FIG. 7C. FIG. 7C shows rounded lens structures 85 which are convex-up. After rounded lens structures 85 are formed, they may be cured to effect polymeric cross-linking of the materials that form rounded lens structures 85. Thermal or uv (ultraviolet) curing may be used. The cross-linking reaction forms rounded lens structures 85 into thermally stable structures that may be used as inner lenses such as inner lens 25 or microlenses 15 shown in FIG. 2B. In an exemplary embodiment, a further intermediate material 26 may be formed over inner lens 25 to planarize the structure. Further intermediate material 26 is chosen to have a lower refractive index than inner lens 25. FIG. 8 is a cross-sectional view showing an exemplary double microlens structure. FIG. 8 shows inner microlenses 86 aligned over photodiodes 91. The substructure beneath rounded inner microlenses 86 may include interconnect metal 93 advantageously disposed between the microlenses, IMD 92, passivation layer 95 and further dielectric materials. Inner microlenses 86 may be formed of a photosensitive material and according to the procedure shown in FIGS. 7A-7C. Further material 101 is a planarization material that advantageously includes an index of a refraction lower than the index of a refraction of the inner microlenses 86. Color filter 103 and spacer material 105 are formed above planarization level 101 and outer or upper microlenses 107 are aligned over inner lenses 85 and corresponding photodiodes 91. Spacer material 105 may be formed of acrylate, methacrylate, epoxy-acrylate polyimide or other suitable transparent materials. In other embodiments, the rounded lens structures 85 formed as in FIGS. 7A-7C may be used to form an upper or outer microlens such as microlens 15 shown in FIG. 2B or they may be used to form the only lens in a single microlens image sensor structure.

In another exemplary embodiment, the microlenses or inner lenses may be formed using a silylation process. The silylation process involves reacting a reactive portion of photoresist with a silicon-containing agent to form a permanent lens. In silylation, an active hydrogen is replaced by an alkyl-silyl group such as trimethylsilyl (TMS) or t-butyldimethyl-silyl (t-BDMS). Silylation reagents are generally moisture-sensitive and various activated photoresists may be used as silylation reagents. According to the silylation embodiment such as shown in FIGS. 9A-9D, photoresist 113 is formed over underlying layer 115 which may be a passivation layer such as silicon nitride, or another suitable dielectric layer. Positive or negative photoresist may be used. Coating techniques may be used for coating photoresist 113. Lithographic techniques are then used to form reactive portion 117 of photoresist 113. According to the embodiment in which photoresist 113 is negative photoresist, reactive portion 117 is the exposed portion. According to the exemplary embodiment in which photoresist 113 is positive photoresist, reactive portion 117 is the unexposed portion of photoresist 113. Masking procedures may be used. Photoresist 113, including reactive portion 117, is then exposed to a silicon-containing agent. The silicon-containing agents may be gaseous or liquid. In one exemplary embodiment, the silicon-containing agent may be HMDS (hexamethyldisilazane), but other silicon-containing agents may be used in other exemplary embodiments. Reactive portion 117 may include functional groups such as a —COOH or an —OH group such as may be created by photon irradiation. When photoresist 113 is exposed to the silicon-containing agent, only reactive portion 117 reacts with the silicon-containing agent to become silylated.

Figure 9A:
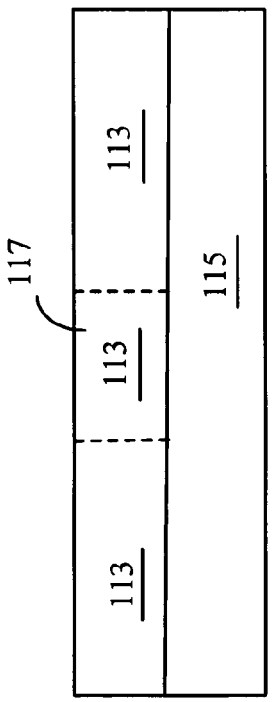
FIGS. 9A-9D are cross-sectional views showing a sequence of operations used to form an exemplary microlens according to the invention.
Figure 9B:
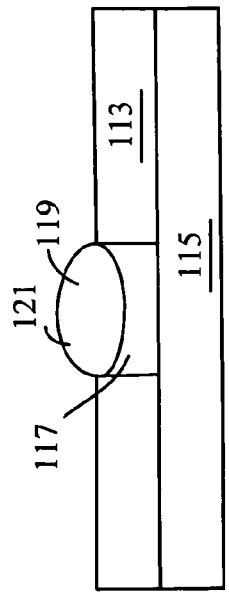
Figure 9C:
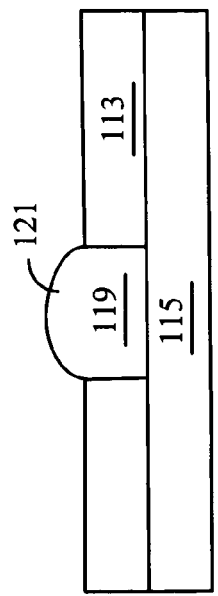
Figure 9D:
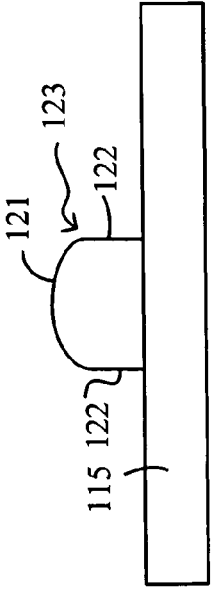

FIG. 9B shows the beginning of the silylation process in which reactive portion 117 swells as it reacts with the silicon-containing agent. Silylated portion 119 forms within reactive portion 117 of photoresist 113. Upper surface 121 becomes rounded and begins to take on a convex-up lens shape. In another embodiment, FIG. 9B shows the ending of the silylation process in which reactive portion 117 swells as it reacts with the silicon-containing agent. Silylated portion 119 forms within reactive portion 117 of photoresist 113. Upper surface 121 becomes rounded and begins to take on a convex-up lens shape. Lower surface 121 becomes rounded and take on a convex-down lens shape. FIG. 9C shows a further step along the silylation process in which silylated portion 119 has been completely formed. Developing processes may be used to develop away non-silylated portions of photoresist 113 and form the structure shown in FIG. 9D. FIG. 9D shows silylated lens 123 including rounded upper surface 121, formed above underlying layer 115. In other embodiments, silylated lens 123 may take on other shapes. For example, it may be a completely convex-up form without vertical walls 122. A planarizing layer or layers may then be formed over silylated lens 123. Silylated lens 123 may be used as an inner lens of a double-microlens structure such as shown in FIG. 2A which includes inner silylated lens 23. In other exemplary embodiments, the silylated lens may be the upper or outer microlens in a double-microlens structure (e.g. microlens 15 in FIGS. 2A-2F) and in yet another exemplary embodiment, the silylated lens may be the sole microlens in a single micro-lens structure.

The preceding exemplary microlens embodiments may be used in various combinations to form various single or double microlens image sensors.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An imaging device comprising:
    a substrate having a plurality of photosensors formed therein or thereon, a corresponding plurality of inner lenses disposed over said plurality of photosensors, a color filter disposed over said plurality of inner lenses, and a corresponding plurality of microlenses disposed over said color filter, wherein said inner lenses are formed of an organic material impregnated with silicon.

2. The imaging device as in claim 1, wherein said inner lenses are disposed within an inter-metal dielectric.

3. The imaging device as in claim 1, wherein said inner lenses are disposed within a passivation layer.

4. The imaging device as in claim 1, wherein said inner lenses are convex in shape.

5. The imaging device as in claim 1, wherein said inner lenses comprise Fresnel lenses.

6. The imaging device as in claim 1, wherein said organic material comprises a photoresist.

7. The imaging device as in claim 1, wherein an area ratio of said inner lenses to said photosensors is substantially larger than 2.

8. The imaging device as in claim 1, wherein said inner lenses are bi-convex in shape.

9. The imaging device as in claim 1, wherein said inner lenses are plano-convex in shape.

10. The imaging device as in claim 1, wherein adjacent lenses of said plurality of inner lenses share a common edge.

11. The imaging device as in claim 1, wherein said microlenses are convex in shape.

12. The imaging device as in claim 1, wherein said microlenses comprise Fresnel lenses.

13. The imaging device as in claim 1, wherein said microlenses are formed of an organic material.

14. The imaging device as in claim 13, wherein said organic material comprises a photoresist.

15. The imaging device as in claim 1, wherein said microlenses are formed of a dielectric material.

16. The imaging device as in claim 15, wherein said dielectric material comprises silicon oxide.

17. The imaging device as in claim 15, wherein said dielectric material comprises silicon nitride.

18. The imaging device as in claim 1, wherein said microlenses are formed of an organic material impregnated with silicon.

19. The imaging device as in claim 1, wherein an area ratio of said microlenses to said photosensors is substantially larger than 2.

20. The imaging device as in claim 1, wherein said microlenses are bi-convex in shape.

21. The imaging device as in claim 1, wherein said microlenses are plano-convex in shape.

22. The imaging device as in claim 1, wherein adjacent lenses of said plurality of microlenses share a common edge.

* * * * *